US005457603A

United States Patent [19]

Leeb

[11] Patent Number: 5,457,603

[45] Date of Patent: Oct. 10, 1995

[54] ARRANGEMENT FOR COOLING ELECTRONIC EQUIPMENT BY RADIATION TRANSFER

[75] Inventor: Karl-Erik Leeb, Djurhamn, Sweden

[73] Assignee: Telefonaktienbolaget LM Ericsson, Stockholm, Sweden

[21] Appl. No.: 220,399

[22] Filed: Mar. 30, 1994

Related U.S. Application Data

[63] Continuation of Ser. No. 964,833, Oct. 22, 1992, abandoned.

[30] Foreign Application Priority Data

Oct. 24, 1991 [SE] Sweden .................................. 9103109

[51] Int. Cl.$^6$ ........................................ H05K 7/20

[52] U.S. Cl. ........................ 361/698; 165/80.4; 174/15.1; 174/16.3; 361/689; 361/690; 361/699; 361/705

[58] Field of Search ................................ 165/80.2, 80.3, 165/80.4, 104.33; 174/15.1, 16.3; 257/700, 714; 361/689, 690, 698, 699, 704, 705, 707, 711, 713, 720, 721, 816, 818

[56] References Cited

U.S. PATENT DOCUMENTS

| | | | |
|---|---|---|---|
| 3,893,307 | 7/1975 | Jacobs . | |
| 4,037,270 | 7/1977 | Ahmann et al. | 361/385 |
| 4,564,061 | 1/1986 | Rauth et al. . | |
| 5,088,005 | 2/1992 | Ciaccio | 364/385 |

FOREIGN PATENT DOCUMENTS

| | | | |
|---|---|---|---|
| 0080538 | 6/1983 | European Pat. Off. . | |
| 0082280 | 6/1983 | European Pat. Off. . | |
| 2847567 | 5/1980 | Germany . | |
| 441889 | 11/1985 | Sweden . | |
| 2052164 | 1/1981 | United Kingdom | 361/690 |

OTHER PUBLICATIONS

Aichelmann, Jr. et al, "Three–Dimensional MLC Substrate Integrated Circuit Support Package" IBM Tech. Disc. Bulletin, vol. 20, No. 11A, Apr. 1978, 361/385, pp. 4349–4350.

IBM Technical Disclosure Bulletin, "Heat Exchanger Modules for Data Processor with Valves Operated by Pressure from Cooling Water Pump" vol. 30, p. 419 (Oct. 1987).

Patent Abstract of Japan, vol. 12, No. 207, abstract of JP 63–006864 (Jan. 12, 1988).

*Primary Examiner*—Gregory D. Thompson

*Attorney, Agent, or Firm*—Burns, Doane, Swecker & Mathis

[57] ABSTRACT

An arrangement for cooling electronic equipment in a space by using radiation transfer, wherein the equipment includes heat-emitting electronic components mounted on a circuit board or the like. According to the invention, each circuit board or the like is surrounded by a cold plate which is spaced from the circuit board. The surfaces of both the circuit board and the plate are treated so as to have a high IR-radiation coefficient, wherein heat is transferred from the hot circuit board to the relatively colder plate by radiation.

7 Claims, 2 Drawing Sheets

ARRANGEMENT FOR COOLING ELECTRONIC EQUIPMENT BY RADIATION TRANSFER

This application is a continuation of application Ser. No. 07/964,833, filed Oct. 22, 1992, now abandoned.

TECHNICAL FIELD

The present invention relates to an arrangement for cooling electronic equipment in a space by means of radiation transfer, this equipment including heat-transmitting electronic components mounted on a circuit board or like device.

DESCRIPTION OF THE PRIOR ART

In normal operation, electronic components operate with energy conversion, such as to generate heat. This heat endeavours to raise the temperature of the components, therewith shortening the useful life thereof. Consequently, in the case of equipment which includes many components and where it is desired to achieve a long useful life, it is desirable to conduct or lead the heat away from the components concerned. This is often effected by flushing the components or the corresponding circuit board on which the components are mounted with air of a lower temperature, so as to effect a heat transfer. Thus, the heated air is removed and replaced with fresh air which has a lower temperature.

With certain equipment, the electronic devices generate so much heat that special measures must be taken in order to remove the heat therefrom. These measures may comprise leading the heat away from components and circuit boards to a heat transfer device, the coolant contact surface of which is enlarged with the aid of fins or pins, the coolant normally being air. Other measures which contribute towards an increase in the heat transfer effect include higher air speeds and the use of an air mixture, comprising air which has already been heated and cold air, on microlevels along the surfaces of the heat transfer device. In those cases when a particularly good cooling effect is desired, the coolant may consist of a cold liquid which is permitted to pass in contact with the heat transfer devices. The thus heated liquid can then be used in another stage to transfer heat to the air in a separate heat transfer device having a very large contact surface area, the air then forming a secondary cooling medium. The heat transfer in the secondary device can be improved by lowering the temperature of the secondary coolant to a value beneath room temperature, with the aid of a heat pump. This is often desirable in tropical climates and also in order to obtain a sufficiently high temperature difference through the fixed parts and wants of the construction, with the intention of achieving a sufficiently high heat flow, justified by the desired temperature control of the critical parts of the construction.

When the temperature is lowered to beneath room temperature, there is a risk of that moisture carried by the air will condense on sensitive and susceptible parts of the construction, resulting in corrosion and leakage problems. Another problem which is often encountered resides in the fact that the flow of heat from the components to the heat transfer device is often blocked to a greater or lesser extent by material which has a relatively poor thermal conductivity and which is unsuitably configured. From the aspect of thermal conductivity, joints between different parts of the heat conducting parts are often unsuitable and constitute a problem.

There is a general endeavour to provide equipment which has few moving parts and which is of simple and robust construction with regard to manufacturing costs, physical volume and reliability. Complications in this respect constitute a problem.

SUMMARY OF THE INVENTION

The present invention relates to an arrangement for cooling electronic components by means of radiation transfer and the object of the invention is to solve the aforesaid problems. More specifically, the invention relates to an arrangement for leading heat away from a circuit board by utilizing generally the IR-radiation emitted by the hot components. The principle of optimizing IR-radiation has earlier been ignored in the construction of cooling arrangements for circuit boards of moderate power generation. The invention provides an arrangement having the characteristic features set forth in the following Claims.

The invention also solves several problems associated with air and liquid cooling, such as few moveable parts, simple construction, reliability, and also the problem represented by condensation when cooling with the aid of a liquid.

Other objects of the present invention and advantages afforded thereby will be apparent from the following description, which is made with reference to a preferred exemplifying embodiment of the invention and also with reference to the accompanying drawing.

BEST MODE OF CARRYING OUT THE INVENTION

Figure 1:
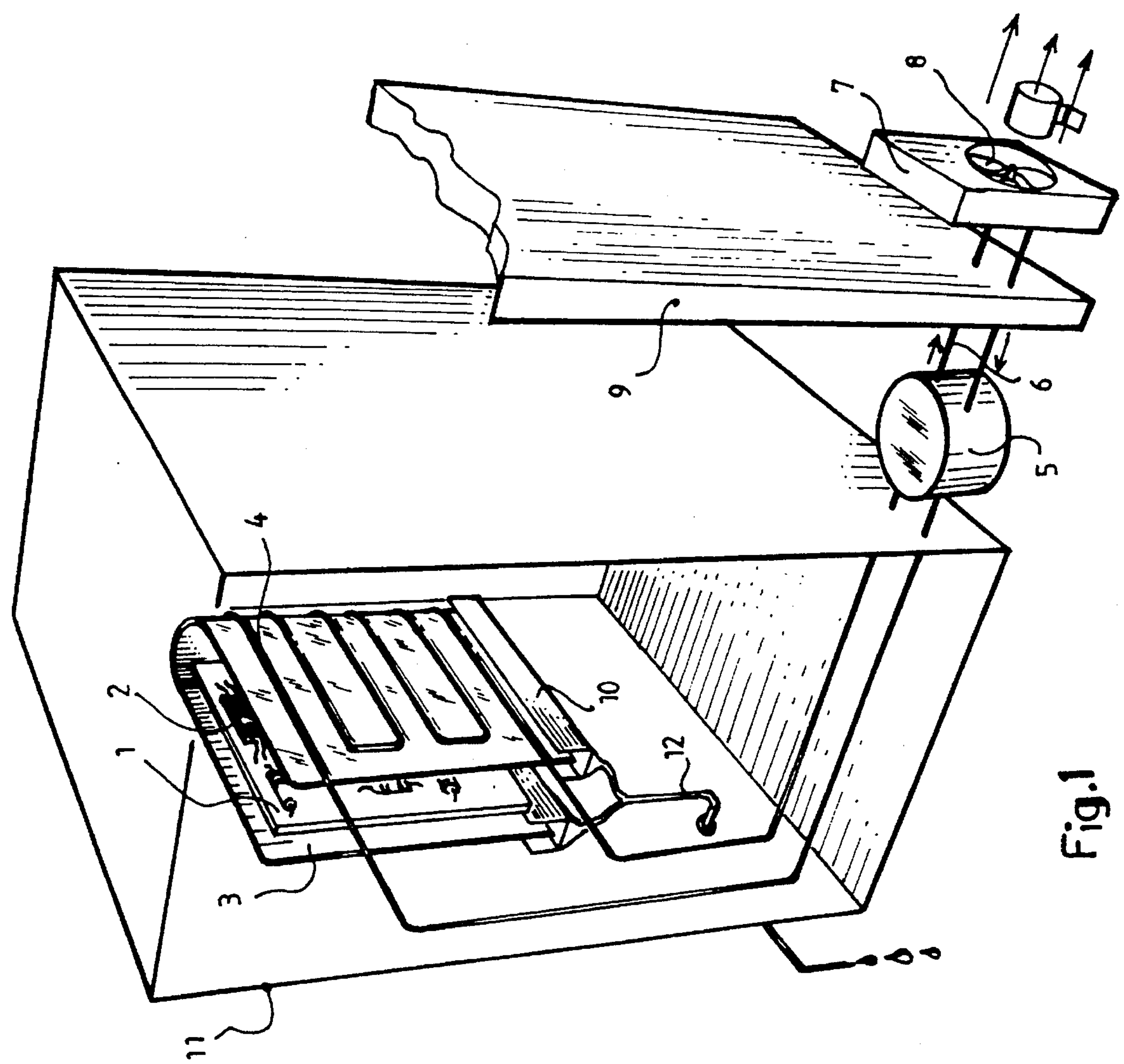
FIG. 1 of the accompanying drawing illustrates principally an exemplifying embodiment of the inventive arrangement.

An exemplifying embodiment of the invention will now be described with reference to FIG. 1. The described embodiment can be modified in different ways and the invention is limited solely by the following Claims. Illustrated in the drawing is a circuit board 1 on which heat-generating electronic components 2 are mounted. The temperature of the components 2 and the circuit board 1, which is mounted in a space, for instance, an apparatus cabinet, will therefore increase, for instance, to a temperature of 70° C. The heat is conducted away by means of a U-shaped plate 3 which surrounds the circuit board 1 and which is provided integrally with a cooling liquid channel or loop 4. The cooling liquid cools the plate 3 to a low temperature, e.g., a temperature around +4° C.

The surfaces of the circuit board 1 and the plate 3 are treated in a manner such as to have a high coefficient $\epsilon$ for IR-radiation, for instance, a coefficient of 0.9. The circuit board 1 will therefore emit more IR-radiation than it receives from the plate 3, in accordance with the following formula known from radiation physics.

$$P=\epsilon\delta(T_1^4-T_2^4)$$

If a reasonable simplification is made so that radiation is solely exchanged between the relatively closely positioned and mutually parallel circuit board 1 and the plate 3, the net heat flow from the circuit board 1 to the plate 3 with the above exemplified temperatures and radiation coefficient will then be:

$$P=.9\cdot 5.67\cdot 10^{-8}[(273+70)^4-(273+4^4]=404 W/m^2$$

If the power density is applied to the circuit board 1, it is observed that the board radiates from both the front and the rear side thereof. Thus, theoretically, the heat developed by the circuit board 1 may be in the order of 2×404=808 W/$m^2$. This amount of cooling is often sufficient.

Since heat is applied to the plate 3, it is necessary to cool the plate by pumping a cold liquid through the loop 4. This liquid is cooled and pumped with the aid of a cooling compressor 5. The liquid is pumped further through a pipe 6 to a cooler 7 which has a large air-contact surface area, the air being blown at high velocity through the cooler 7 by means of a fan 8, wherein the heat is transferred to the air. The cooler may be placed conveniently outside the external wall 9, when the equipment with circuit board 1 is placed indoors.

When the relative humidity of the air is high, the moisture in the air will condense on the plate 3. This condensate is collected in a channel 10 and is led away from the space or cabinet 11 through a drainage pipe 12 and discharged at a location where it can do no damage. The air within the space 11 is therefore dehumidified. The air within the space 11 is also cooled by the cold plate 3, wherein the cooling process is assisted by natural convection.

The object of obtaining a simple cooling system which comprises only a few moveable parts and with minimum conduction in static materials and only a few joints with problematic thermal abutment is therefore achieved. Furthermore, the air in the cabinet 11 is dry and, since the cabinet 11 is airtight, dust contaminated air is not liable to enter the cabinet and, disturb the electronic equipment. It is possible to arrange in the cabinet a forced-air recycling cooling facility when components having additionally large thermal density require additional cooling.

The aforesaid embodiment has been described and illustrated with reference to only one circuit board. As will be understood, it is normal for electronic equipment to comprise many components mounted on a plurality of circuit boards. Each circuit board 1 is surrounded by a respective, individual plate 3 with an integrated cooling loop 4. On the other hand, the various cooling loops 4 are coupled to the common compressor 5. Furthermore, each cooling plate 3 has its own individual collecting channel 10, by means of which the drainage pipes 12 together lead away the water productibility condensation.

Figure 2:
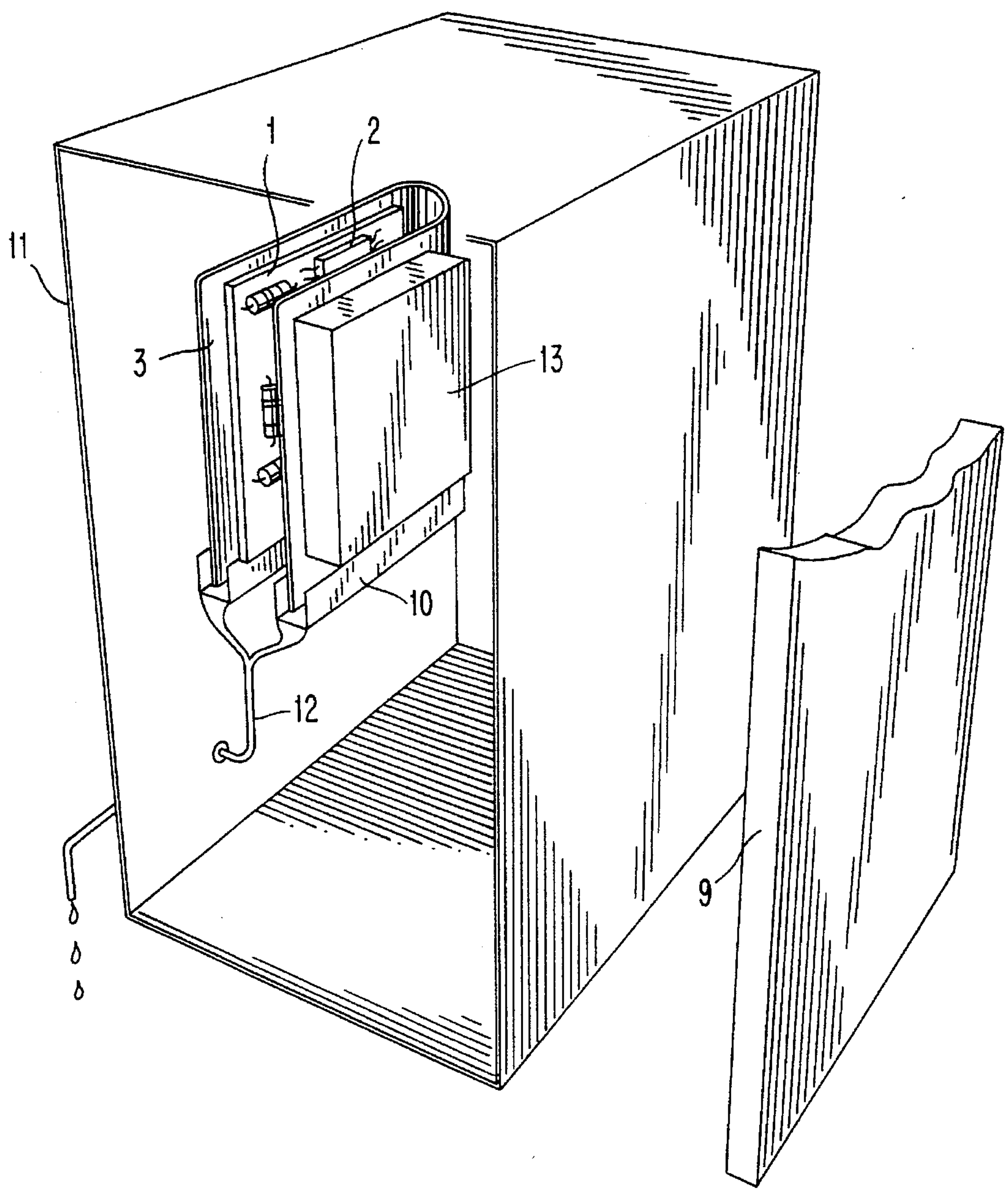
FIG. 2 illustrates another embodiment of the present invention with a Peltier element.

The plate 3 can also be brought to a lower temperature with the aid of Peltier elements 13 disposed on the surface of the plate. Naturally, in this case, the channels 4, the compressor 5 and the remaining parts of the heat exchange system are not required as illustrated in FIG. 2.

It will be understood that the invention is not restricted to the aforedescribed and illustrated embodiment, and that modifications can be made within the scope of the following Claims.

I claim:

1. An arrangement for cooling electronic equipment in an apparatus cabinet by radiation transfer, comprising:

heat emitting electronic components mounted on at least one circuit board, the circuit board being mounted in the cabinet; and a cold plate mounted in the cabinet and spaced around and form the circuit board, wherein surfaces of the circuit board and the cold plate are treated so as to have a high radiation coefficient for IR-radiation, so that heat is transferred from the circuit board to the relatively colder cold plate by radiation.

2. The arrangement for cooling electronic equipment according to claim 1, wherein a coolant channel to carry coolant extends over the whole of the surface of the cold plate and is formed integral with the cold plate, the coolant functioning to carry away the heat received.

3. The arrangement for cooling electronic equipment according to claim 2, wherein a compressor which pumps the coolant through the channel and through a cooler is located outside the cabinet.

4. The arrangement for cooling electronic equipment according to claim 1, wherein the cold plate is U-shaped and the circuit board is located between the legs of the U-shaped cold plate.

5. The arrangement for cooling electronic equipment according to claim 1, wherein the temperature of the surfaces of the cold plate is lowered with the aid of Peltier elements.

6. The arrangement for cooling electronic equipment according to claim 1, wherein a condensate collecting channel is disposed beneath the cold plate.

7. The arrangement for cooling electronic equipment according to claim 6, wherein a drainage pipe conveys condensate away from the collecting channel to a location outside the cabinet.

* * * * *